US008542002B2

(12) United States Patent
Ramesh et al.

(10) Patent No.: US 8,542,002 B2
(45) Date of Patent: Sep. 24, 2013

(54) SYSTEM AND METHOD FOR PERFORMING POWER SPECTRAL DENSITY AND POWER LEVEL MEASUREMENTS

(75) Inventors: P E Ramesh, Bangalore (IN); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 432 days.

(21) Appl. No.: 12/848,332

(22) Filed: Aug. 2, 2010

(65) Prior Publication Data

US 2011/0025302 A1 Feb. 3, 2011

(30) Foreign Application Priority Data

Jul. 31, 2009 (IN) ......................... 1762/MUM/2009
Jul. 27, 2010 (IN) ......................... 1762/MUM/2009

(51) Int. Cl.
*G01R 19/00* (2006.01)

(52) U.S. Cl.
USPC .................................... 324/76.11; 324/76.19

(58) Field of Classification Search
None
See application file for complete search history.

(56) References Cited

U.S. PATENT DOCUMENTS

2007/0027675 A1* 2/2007 Hertz ........................ 704/200.1

* cited by examiner

*Primary Examiner* — Minh N Tang

(74) *Attorney, Agent, or Firm* — Thomas F. Lenihan; Francis I Gray; Marger, Johnson & McCollom, P.C.

(57) ABSTRACT

A system and method for performing power spectral density (PSD) and power level measurements for measuring PSD required by 10GBaseT applications, using a single test and measurement instrument, such as a real time oscilloscope is described. That is, an oscilloscope includes processing circuitry which receives an input signal and converts it to raw data, it then transforms the raw data into specific analyzed displayable data by algorithmically deriving PSD from spectral data and plotting the PSD data along with limit values on a display screen of the oscilloscope.

9 Claims, 5 Drawing Sheets

SYSTEM AND METHOD FOR PERFORMING POWER SPECTRAL DENSITY AND POWER LEVEL MEASUREMENTS

CROSS REFERENCE TO RELATED APPLICATIONS

Applicants hereby claim priority from Indian Provisional Patent Application 1762/MUM/2009, entitled A SYSTEM AND METHOD FOR PERFORMING THE POWER SPECTRAL DENSITY AND POWER LEVEL MEASUREMENTS, filed 31 Jul. 2009, and from Indian Patent Application 1762/MUM/2009, entitled A SYSTEM AND METHOD FOR PERFORMING THE POWER SPECTRAL DENSITY AND POWER LEVEL MEASUREMENTS, filed 27 Jul. 2010.

FIELD OF THE INVENTION

The present invention relates generally to electronic signal testing and measurement, and specifically relates to measurements of Power Spectral Density and Power Level Measurements with a single test and measurement instrument, such as an oscilloscope.

BACKGROUND OF THE INVENTION

The increasing data rates require the equipment used in transmission reception, as well as the medium, to conform to the various standards to maintain accuracy of signals. Accordingly test and measurement instruments need to be able to make such measurements, taking into account the increased electromagnetic radiation effects.

In physics, the signal is usually a wave, such as an electromagnetic wave, random vibration, or an acoustic wave. Power spectral density (PSD) of the signal is the spectral density of the wave multiplied by an appropriate factor. PSD is the power carried by the wave. Power spectral density is commonly expressed in watts per hertz (W/Hz) or dBm/Hz.

The signals in 10GBASE-T are PAM (Pulse Amplitude Modulation) level with random patterns. These signals are sent over four lanes from the Transmitter on Cat 5 or Cat 6 cables. By measuring PSD and power level, we can ensure that the external interference and adjacent channel interference are sufficiently low such that it does not alter the signal level at the far end so that its encoded digital data can be decoded without any error.

Engineers who use oscilloscopes in their work commonly do not think that an oscilloscope is capable of making the PSD measurement required by 10GBaseT applications. They commonly associate the 8-bit A/D converter in an oscilloscope as only being able to provide a 48 dB dynamic range, and they normally think the −117 dBm/Hz mask level can only be measured by a spectrum analyzer.

It is known in the art that 10GBASE-T Ethernet technology has emerged from 1000 BASE-T to operate at the 10 Gb/sec speed over the same CAT 5 or CAT 6 network cables. This is accomplished by providing four lane transmission, by the use of more efficient smart codes, and by employing DSP technology. The main application of 10G is the gigabit switch uplink which is used for server clustering, data center interconnects, and it may also take part in desktop computer in future.

10 Gb/sec speed is accomplished by transmitting 2.5 Gb differential signals over a 4-pair cable with each pair aggregating to 10G. When the signaling uses 16 PAM levels, it is important that interference should be kept to minimal. Otherwise, the interference alters the signal level and subsequently error occurs on the transmission. The data is sent over the Cat 5 or Cat 6 cable. Channel limits play a vital role in the near-end cross talk, far-end cross talk, return-loss. So, DSP has been designed to provide the required suppression up to 150 dB/Hz.

10GBASE-T uses a two-dimensional code and is created using a pair of adjacent PAM 16 symbols. The distance between the adjacent points is increased using DSQ 128 constellation to provide immunity to noise. Each pair of wire operates at 800 MHz symbol rate, which puts Nyquist frequency for baseband signaling at 400 MHz. So the upper frequency limit of 500 MHz for the cable will be good enough to carry the signal.

Power spectral density is a method of scaling the amplitude axis in certain spectral values which consist of random signals rather than deterministic signals. Because a random signal has energy spread out over a frequency band, it is not meaningful to speak of its RMS value at any specific frequency. It makes sense to consider its amplitude in a fixed frequency band, usually 1 Hz. PSD is defined in terms of amplitude squared per hertz and is thus proportional to the power delivered by the signal in a one-hertz band.

It is important that a received signal be immune to possible noise interference when we run the cable with pairs in close proximity to each other. The source of the interference is ANEXT (Alien Near end cross talk, Alien Far end cross talk). The typical power spectral density of that interference is shown in prior art FIG. 1.

Referring to prior art FIG. 1, a graph of Signal and Noise Spectra (Ptx=4.2 dBm, L=11 m) includes a number of plots shown as a function of PSD vs. frequency. Specifically, plot 110 is a plot of the received signal (Rx); plot 112 is a plot of the total noise; plot 114 is a plot of −48 db txD Floor; plot 116 is a plot of 10G ANEXT; plot 118 is a plot of 10G AFEXT; plot 120 is a plot of 1G ANEXT; plot 122 is a plot of −147 Rx Noise; plot 124 is a plot of 9.0b ADC noise; and plot 126 is a plot of −150 Background noise.

For Interoperability, it is necessary to ensure the SNR margins are good enough in the presence of the 1000 BASE-T and background noise. Maximum output power is necessary to manage the levels of 10GBASE-T ANEXT and AFXT. So, the mask for the PSD is defined such that the upper mask provides an EMI-based bound for the signal and lower mask ensures that the output stream is compatible with expected equalizer capabilities.

The plot of power spectral density Vs frequency is shown in prior art FIG. 2, in which line 210 is a mask upper limit line as specified in IEEE Ethernet standards document, plots, 212 and 214 are PSD spectral plots of existing Ethernet signals. Plot 216 is the mask lower limit line. The plot of power spectral density Vs frequency of FIG. 2 may be transformed to the PSD limit as:

Upper Limit $$\text{Upper } PSD(f) \le \begin{cases} -78.5\ dBm/\text{Hz} & 0 < f \le 70 \\ -78.5 - \left(\frac{f-70}{80}\right)\ dBm/\text{Hz} & 70 < f \le 150 \\ -79.5 - \left(\frac{f-150}{58}\right)\ dBm/\text{Hz} & 150 < f \le 730 \\ -79.5 - \left(\frac{f-330}{40}\right)\ dBm/\text{Hz} & 730 < f \le 1790 \\ -116\ dBm/\text{Hz} & 1790 < f \le 3000 \end{cases}$$

Lower Limit $$\text{Lower } PSD\ (f) \geq \begin{cases} -83\ dBm/\text{Hz} & 5 \leq f \leq 50 \\ -83 - \left(\frac{f-50}{50}\right)\ dBm/\text{Hz} & 50 < f \leq 200 \\ -86 - \left(\frac{f-200}{25}\right)\ dBm/\text{Hz} & 200 < f \leq 400 \end{cases}$$

Power spectral density (PSD) refers to the amount of power per unit (density) of frequency (spectral) as a function of the frequency. The PSD describes how the power (or variance) of a time series is distributed with frequency. By knowing the power spectral density and system bandwidth, the total power can be calculated.

To qualify the 10G BASE-T, we have to measure the power spectral density of the transmitter signal and ensure that spectral density is within the upper limit and lower limit of the mask. We also need to measure the power level such that it meets the requirement.

At present, the PSD is measured using a spectrum analyzer and noise marker function. Here, we have to move the noise marker based on the required frequency resolution, then log the results and subsequently plot the PSD curve, and then check for limit violations.

SUMMARY OF THE INVENTION

The present invention performs power spectral density (PSD) and power level measurements using a single test and measurement instrument, such as for measuring PSD required by 10GBaseT applications. That is, an oscilloscope includes processing circuitry which receives an input signal and converts it to raw data, it then transforms the raw data into specific analyzed displayable data by algorithmically deriving PSD from spectral data and plotting the PSD data along with limit values on said display screen.

Accordingly, a method for performing power spectral density (PSD) and power level measurements using a single instrument is described. In one embodiment herein, a single test and measurement instrument, such as an oscilloscope, is set up to obtain performance similar to that of a spectrum analyzer. PSD may be then algorithmically derived from spectral data and the PSD data may be plotted along with limit values. Thereafter, the power value of the signal may be calculated from the PSD data for a user selectable frequency range. The PSD curve may be plotted on the reference channel with limit values and finally the result may be displayed as a pass/fail verdict.

This enables the customer to use the oscilloscope for all measurements and avoid the complexity and expense of using a combination of an oscilloscope and a spectrum analyzer to perform the 10GBASE-T testing.

One skilled in the art will note that the math required to derive the expressions for use in the oscilloscope to provide the PSD waveform is difficult to derive. In one embodiment herein, the Power spectral density (PSD) is measured by the formula derived as PSD=20*log 10(Z)−50+1.05.

Further, the power value may be measured by the formula derived as Power (inDm)=10*log 10(linear)+1.05.

In another embodiment herein, the MATLAB® algorithm may be used to derive the power from PSD data wherein the Power spectral density (PSD) curve may be represented by the expression—Math1=10*log(Math3)−50+1.05. Further, the Power can be calculated by a math function set on the oscilloscope as: Math4=10*log(Intg(Math3*Math3)/(0.001*100*1e6))+1.05 wherein Measuring the maximum on math4 waveform gives the power value.

DETAILED DESCRIPTION OF THE INVENTION

Figure 1:
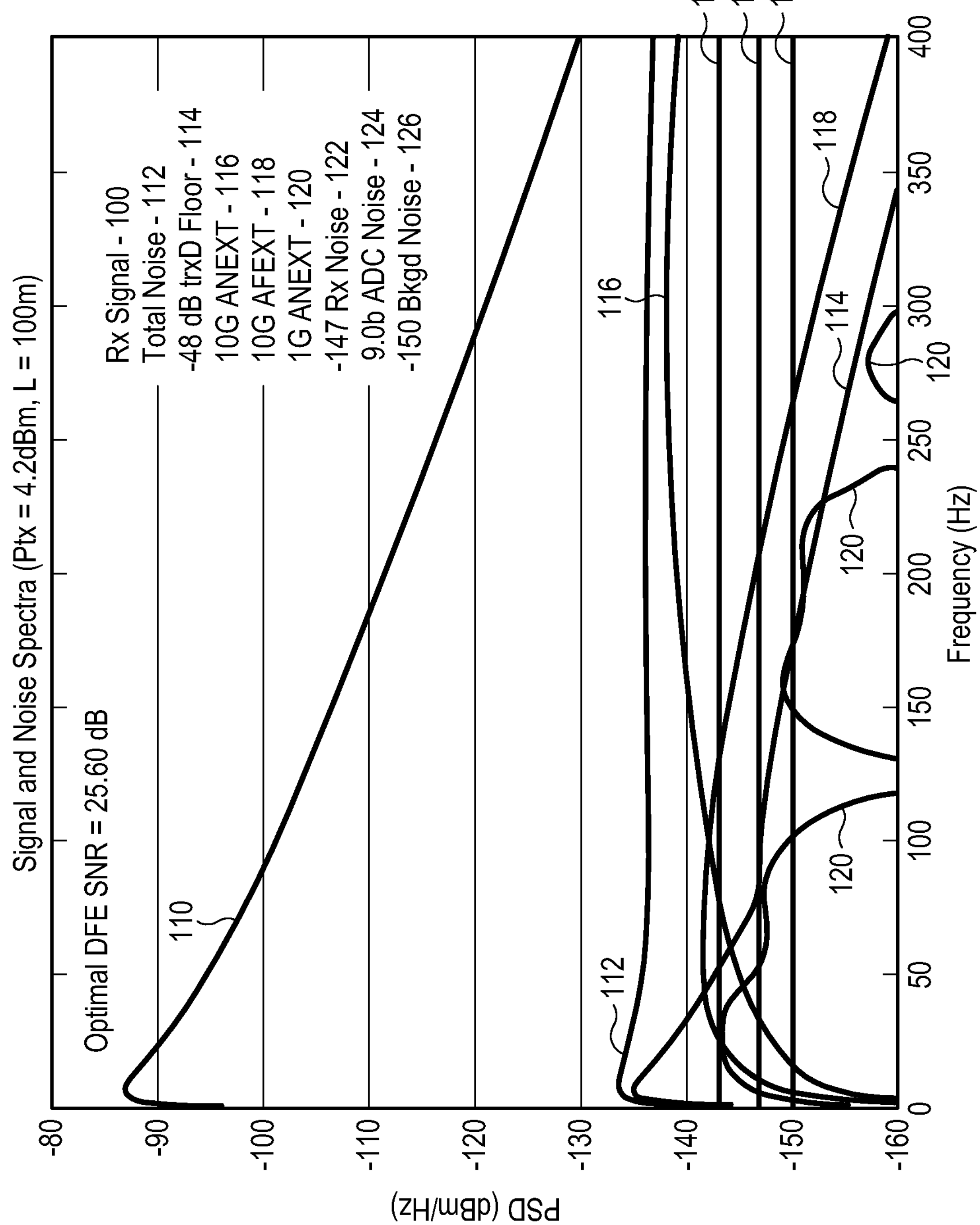
FIG. 1 shows a typical power spectral density of interference.
Figure 2:
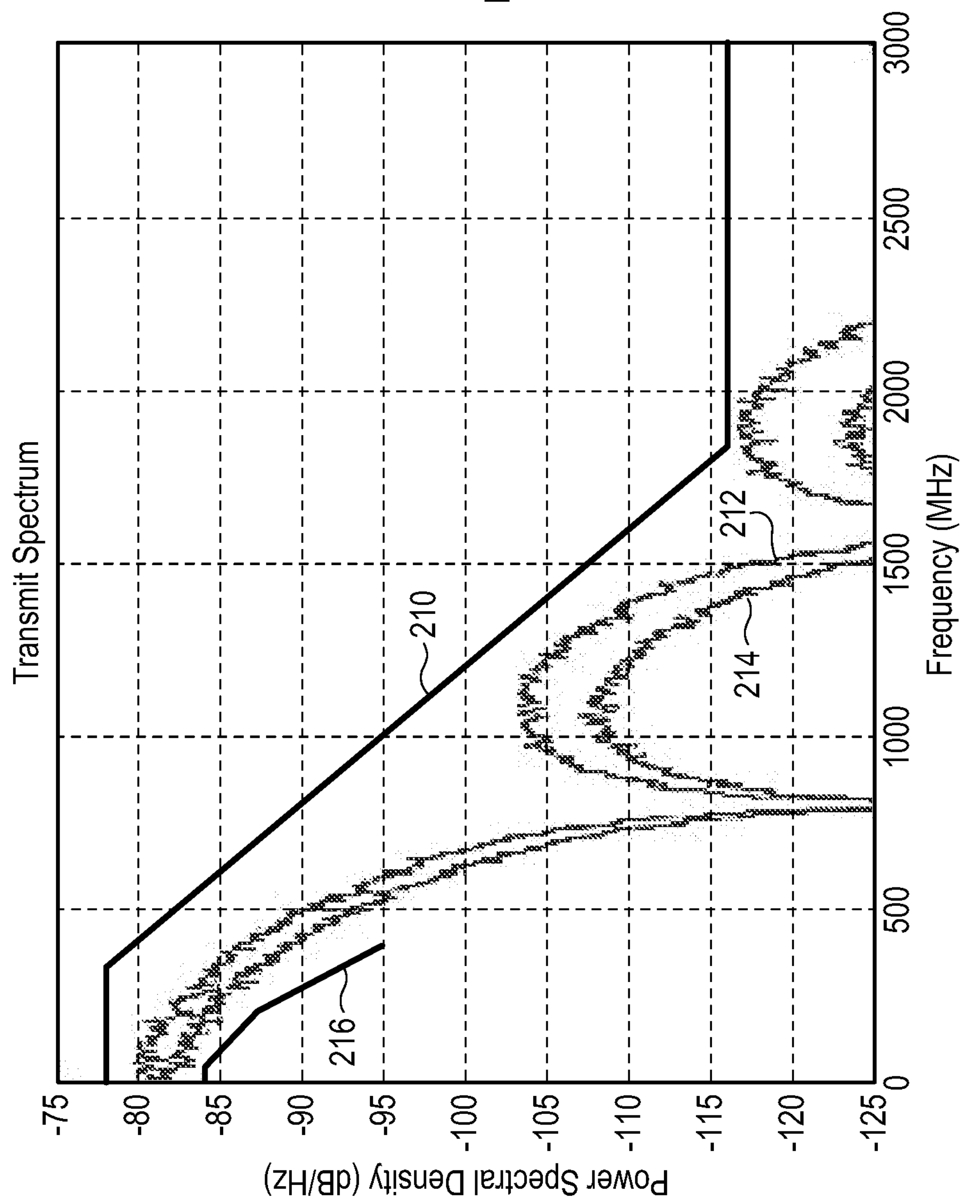
FIG. 2 shows a plot of power spectral density versus frequency.

A system and method for performing the power spectral density and power level measurements is described. In one embodiment the method allows measurement of the PSD using a real time oscilloscope. In one embodiment, the oscilloscope measures the power level from the analogue spectrum, checks the measured PSD with limit value, and gives the pass/fail verdict. Also, a PSD curve may be plotted on the reference channel with limit values to give the verdict of pass/fail. The subject invention enables a customer to use an oscilloscope for all measurements and avoid the complexity and expense of using a combination of an oscilloscope and a spectrum analyzer to perform the 10GBASE-T testing.

The subject invention provides an equivalent setting on the oscilloscope such that the measured PSD is comparable to spectrum analyzer, as follows.

Setting the oscilloscope to get performance similar to that of a spectrum analyzer (sample rate, record length, resolution bandwidth, windowing, and averaging).

Algorithmically deriving PSD from the spectral data and plotting the PSD data along with limit values.

Calculating power value of the signal from the PSD data for a user selectable frequency range.

Method for Power Spectral Density (PSD) Measurements

PSD represents the total power as a density to weight. All transmission systems have a finite bandwidth. In the case of 10G BaseT, it is 400 MHz. However, engineers in the communications industry intend to do this measurement up to 3 GHz which is more than the third harmonic of fundamental bit rate 800 MHz. They would also like to measure the Power under the PSD curve that is between 3.2 dBm levels to 5.6 dBm level.

PSD in dBm/Hz=Power in dBm−10 log 10(Resolution-bandwidth)

Since a frequency sample is of a fixed increment, for any frequency sample we use the term, “bin”.

For any frequency bin, Power in dBm is calculated as follows.

$$\text{Power in dB}=10*\log 10(\text{Power}/P_{ref}) \quad \text{EQ1}$$

$P_{ref}$ is 1 when we calculate in dB $$\text{Real Power}=Vrms*Vrms/R \quad \text{EQ2}$$

Here we need to measure the power in 100 Ohms and not in 50 Ohms. Where Vrms is Voltage in linear scale, R=100 ohm input impedance.

Substituting EQ2 into EQ1:

$$\text{Power(in } P_{dB})=10*\log 10(Vrms*Vrms/100)$$

$$\text{Power(in dBm)}P_{dbm}=P_{db}+30$$

Is equivalent to:

$$P_{dBm}=20*\log 10(Vrms*sqrt(2))+10$$

The equation dBm=20 log(1.414|V|)+10−10 log(RBW) has taken into account the fact that V was across 100 ohms. That's part of where the +10 came from.

This is equivalent to performing a calculation on a spectral waveform,

PSD=Avg(20*log(|*V*|/1))+10−10*log(1*10^^6) which is deduced to . . .

PSD=AVG(20*log(|*V*|/1))−50

Add 1.05 to the above equation as a correction factor since we shall be averaging the Spectral waveform and then squaring it which is not the same as squaring and averaging it.

Let x be the signal and X be the spectrum of the signal $X_i=x_i(n)$ where n varies from 1 to N where N is the record point considered for the measurement and i is the ith waveform.

$$Xi=FFT(xi); \quad \text{EQ4}$$

$$Y_i=Xi(0)+2*Xi(n) \text{ where } n \text{ varies from 1 to } N/2-1 \quad \text{EQ5}$$

$$Y=\frac{1}{m}\sum_{i=0}^{m} Yi \quad \text{EQ 6}$$

Where m is the number of waveform record considered for the measurement, we apply the moving average filter 3-point filter to the spectral waveform $$Z=\text{Filter}(Y) \quad \text{EQ7}$$

$$\text{PSD}=20*\log 10(Z)-50+1.05 \quad \text{EQ8}$$

Figure 3:
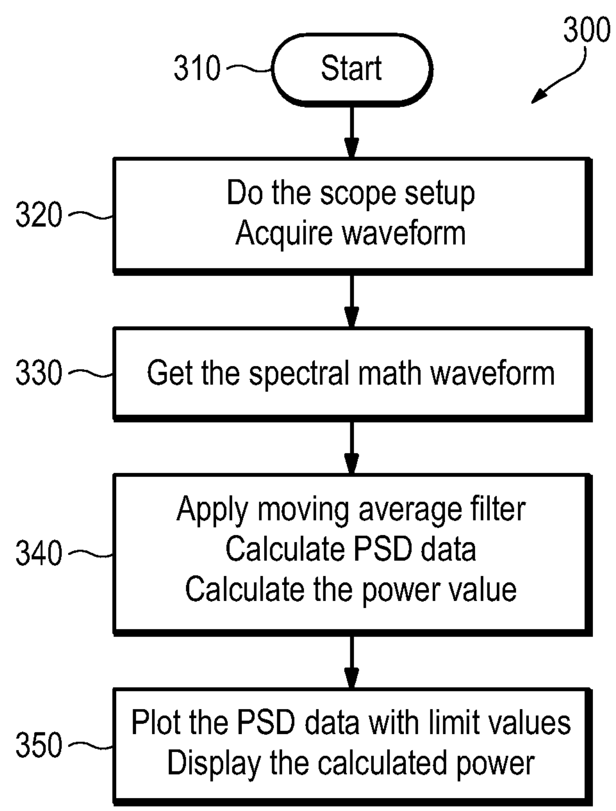
FIG. 3 shows a method for power spectral density as per one embodiment of the present invention.

The flow chart 300 for power spectral density measurement is as shown in FIG. 3. The routine is entered at step 310 and advances to step 320 wherein setup of the oscilloscope is performed, and a signal under test is acquired, digitized and stored. The program then advances to step 330 wherein a spectral math waveform is obtained. At step 340 a moving average filter is applied to the digitized data and PSD data and a Power Value are calculated. At step 350, the PSD data with limited values and power level data are displayed on the screen of the oscilloscope, and the program is exited.

Power Calculation

Power is the area enclosed by the PSD curve from 1 MHz to 3 GHz frequency range. This can be derived using an area calculation.

Where 0.001 is 1 mWatt, 100 is resistance, 1e6 is RBW

Power is the area under the power spectral density curve.

linarea=trapz(frequency(1,a_start:a_end),PSdLin(1,a_start:a_end));

a_start, a_end, define a frequency range interval from 1 MHz to 3 GHz.

Power (in dBm)=10*log 10(linarea)+1.05; where the 1.05 is a correction factor since we are averaging the signal in the spectral domain.

As per one embodiment, a MATLAB® algorithm is used to derive the power from PSD data spectral data.

Figure 4:
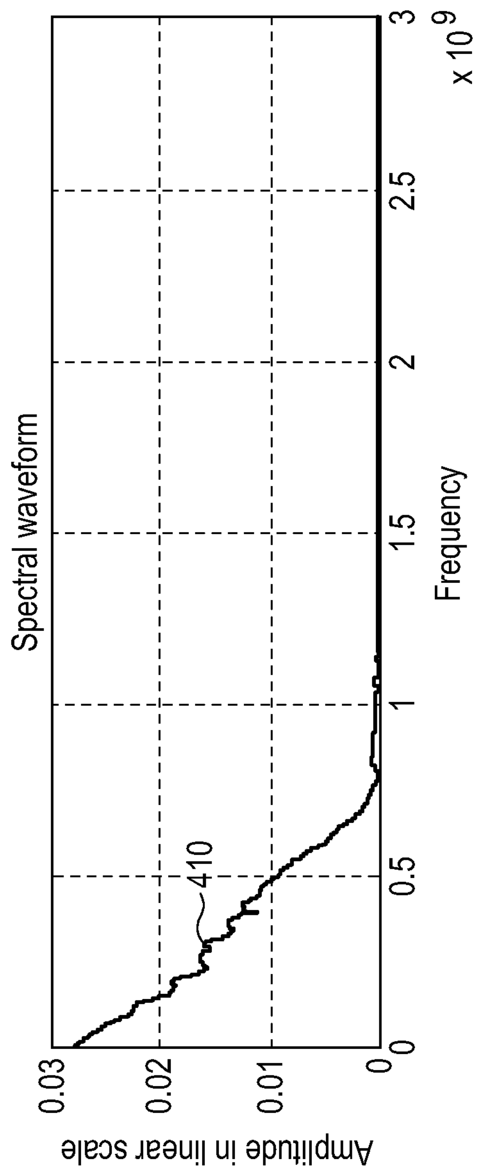
FIG. 4 shows the result showing the power spectral density curve in linear scale as per one embodiment of the present invention.
Figure 5:
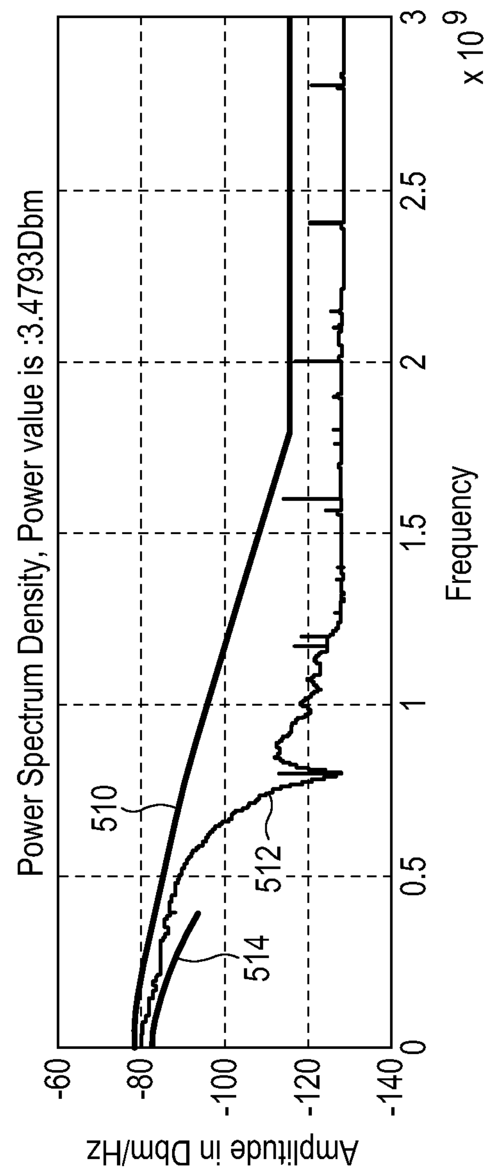
FIG. 5 shows the result showing the power spectral density curve in dBm/Hz scale as per one embodiment of the present invention.

FIG. 4 and FIG. 5 show the result with reference to the measurements of amplitude vs. frequency in different scales. In FIG. 4, plot 410 is a linear vertical scale representation of the PDS plot for an Ethernet signal. Referring to FIG. 5, plots 510 and 514 are the upper and lower mask limit lines for the PSD test, respectively. Plot 512 is the log magnitude plot for the PSD test. The result shown implies that the PSD curve is within limits and passes, and that the measured power value is about 3.479 dBm which is very close to reported power of 3.623 dBm.

We may therefore perform the PSD measurement using the present method by embodying same on the oscilloscope. We may also make use of the math function coupled with a reference waveform as a limit file to indicate a pass or fail condition as well as calculating the power in the waveform using an oscilloscope built-in measurements, as follows.

Define

Math3=AVG(Spect(Ch1)) with spectral setup as 1 MHz RBW, span set to 3 GHz.

Math1=10*log(Math3)−50+1.05; This represent the PSD curve. Set the Reference level (reflevel) as 1 and magnitude as linear here.

Recall the Ref1 upper mask waveform as psdUpperMask.wfm, then Ref2 as lower mask waveform psdLowerMask.wfm. Set the Ref position as 10 divisions, scale as 10 dBm, forms the limit zone.

Define math2=(math1>REF2)*(math1<REF1)

If the waveform fails, then you can see the math waveform M2 which is created whenever the failure occurs.

Power Calculation:

Power can be calculated by a math function set on the oscilloscope as follows

Math4=10*log(Intg(Math3*Math3)/(0.001*100*1e6))+1.05

Measuring the maximum on math4 waveform gives the power value. (See FIG. 6)

Define the Measurement

*M2*=min(math2)

If M2 is zero, then the test fails or else if it is 1.0, then the test passes.

The above test is done to compare and evaluate the accuracy of the present method and reflects the results.

| Measurement | Customer result | Our result |
|---|---|---|
| PSD curve | Pass(with in limit) | Pass(with in Limit) |
| Power value (LaneA) | 3.62 Dbm | 3.473 Dbm |

Figure 6:
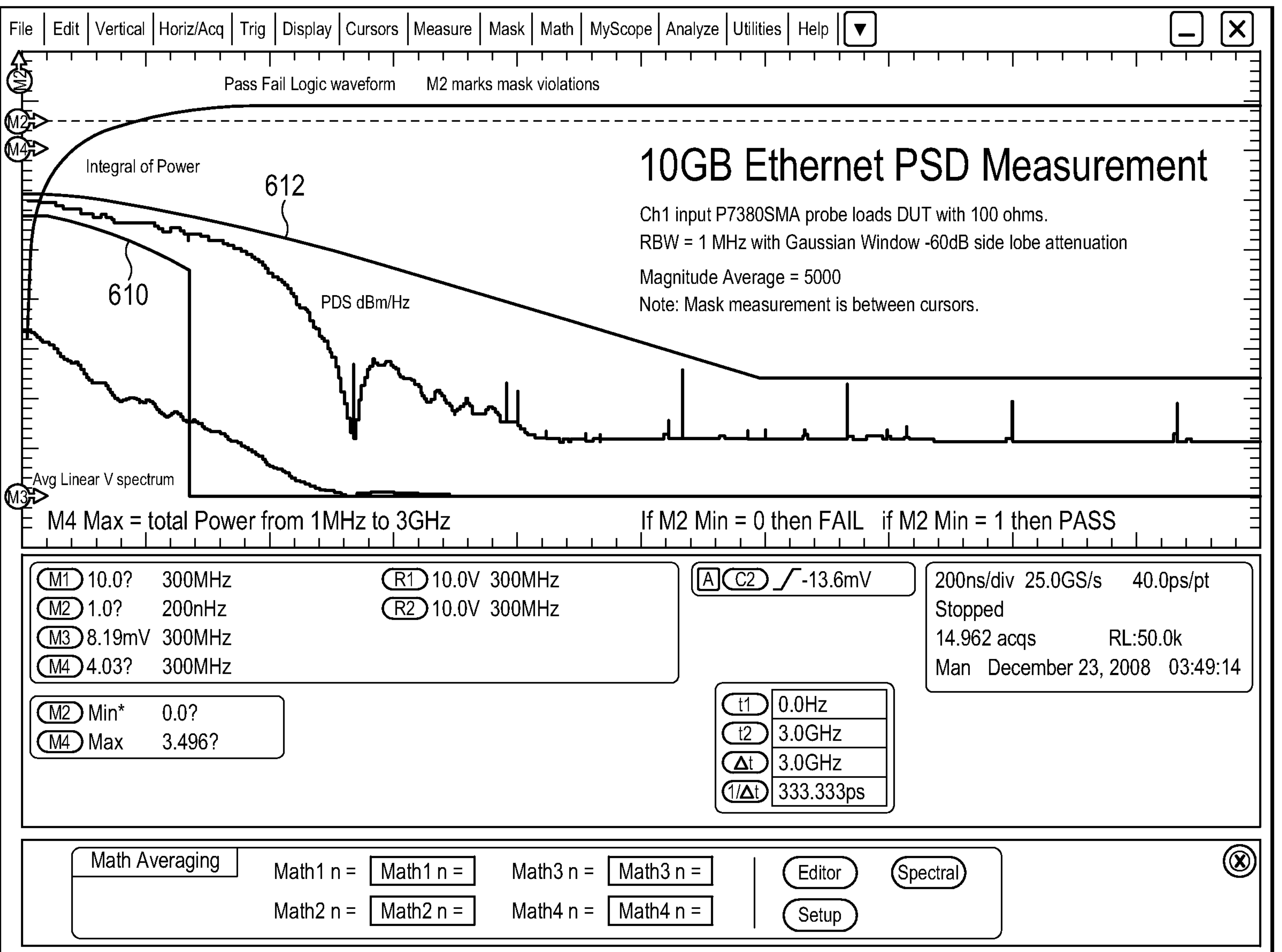
FIG. 6 shows the 10 GB Ethernet power spectral density measurements as per one embodiment of the present invention.

With respect to FIG. 6, lines 610 and 620 are the upper and lower limit lines, and are calculated from equations given by the IEEE.

Therefore, the present invention enables the customer to perform a frequency domain measurement on the oscilloscope itself, thereby allowing the customer to use only one test and measurement instrument to perform measurements in both the time and frequency domains. Generally, if a spectrum analyzer is used, one has to use BALUN to convert the differential to single ended signal, whereas an oscilloscope presents 50 ohms to each of the single ended input signals. There is no need to do a calibration and to apply a correction factor on the PSD and Power measurement for the oscilloscope whereas such calibration does need to be done for a spectrum analyzer.

Further, a spectrum analyzer lacks the flexibility to perform on more than one lane at a time, whereas by using an oscilloscope we can leverage the highest sample rate on all channels and perform this measurement for four lanes simultaneously with improved performance.

Furthermore, performing a moving average on the PSD waveform will smooth the PSD curve even though spurious frequency components of a single frequency sample will average out to follow the running power spectral density value.

We claim:

1. A method for use in an oscilloscope for performing power spectral density (PSD) and power level measurements, the method comprising the steps of:

algorithmically deriving PSD data from spectral data and plotting the PSD data on the oscilloscope along with limit values;

calculating a power value of the signal from the PSD data for a user selectable frequency range;

plotting a PSD curve on a reference channel of the oscilloscope with the limit values; and displaying on a display screen of the oscilloscope a pass result if the PSD curve is within the limit values and a fail result if the PSD curve is not within the limit values.

2. The method as in claim 1, wherein the pass result and fail result enable a user to use only the oscilloscope for all measurements including sample rate, record length, resolution, bandwidth, windowing, and averaging to perform 10GBASE-T testing.

3. The method as in claim 1, wherein the measured PSD data on the oscilloscope is comparable to measured PSD data of a spectrum analyzer.

4. The method as in claim 1, wherein the PSD data is measured by the formula derived as PSD=20*log 10 (Z)−50+1.05, wherein:

Z=Filter (Y), $$Y = \frac{1}{m}\sum_{i=0}^{m} Yi,$$

$Y_i$=Xi(0)+2*Xi(n) where n varies from 1 to N/2−1, $X_i$=FFT($x_i$), i is ith waveform, and x is a signal and X is a spectrum of the signal.

5. The method as in claim 1, wherein the power value is measured by the formula derived as Power (in dBm)=10*log 10(linarea)+1.05, wherein:

linarea=trapz(frequency(1,a_start:a_end),PSdLin(1, a_start:a_end)), and a_start and a_end define a frequency range interval from 1 MHz to 3 GHz.

6. The method as in claim 1, wherein a MATLAB™ algorithm is used to derive the power value from the PSD data.

7. The method as in claim 1, wherein an algorithm is used to represent the PSD curve, said algorithm being Math1=10*log(Math3)−50+1.05, wherein Math3=AVG(spect(Ch1)) with spectral setup as 1 MHz RBW, and span is set to 3 GHz.

8. The method as in claim 7, wherein the power value can be calculated by a mathematical function set on the oscilloscope as:

$$Math4=10*\log(Intg(Math3*Math3)/(0.001*100*1\times 10^{6}))+1.05$$

wherein measuring the maximum on a Math4 waveform gives the power value.

9. A system for use in an oscilloscope for making power spectral density (PSD) and power level measurements, the system comprising:

an oscilloscope receiving an input signal and converting said input signal to raw data, and said oscilloscope having a display screen;

said oscilloscope having processing circuitry, said processing circuitry transforming said raw data into specific analyzed displayable data by algorithmically deriving PSD data from spectral data and plotting the PSD data along with limit values on said display screen;

said oscilloscope processing circuitry calculating a power value of the signal from the PSD data for a user selectable frequency range;

said oscilloscope processing circuitry plotting a PSD curve on a reference channel of said oscilloscope with limit values; and providing a pass result if the PSD curve is within the limit values and a fail result if the PSD curve is outside the limit values; and displaying the pass result or fail result on said display screen of said oscilloscope.

* * * * *